(12) United States Patent
Sutardja et al.

(10) Patent No.: US 8,946,890 B2
(45) Date of Patent: Feb. 3, 2015

(54) POWER/GROUND LAYOUT FOR CHIPS

(75) Inventors: Sehat Sutardja, Los Altos Hills, CA (US); Chung Chyung Han, San Jose, CA (US); Weidan Li, San Jose, CA (US); Shuhua Yu, San Jose, CA (US); Chuan-Cheng Cheng, Fremont, CA (US); Albert Wu, Palo Alto, CA (US)

(73) Assignee: Marvell World Trade Ltd., St. Michael (BB)

( * ) Notice: Subject to any disclaimer, the term of this patent is extended or adjusted under 35 U.S.C. 154(b) by 187 days.

(21) Appl. No.: 13/277,140

(22) Filed: Oct. 19, 2011

(65) Prior Publication Data
US 2012/0098127 A1    Apr. 26, 2012

Related U.S. Application Data

(60) Provisional application No. 61/405,099, filed on Oct. 20, 2010.

(51) Int. Cl.
*H01L 23/498*    (2006.01)
*H01L 23/00*    (2006.01)
(Continued)

(52) U.S. Cl.
CPC ............ *H01L 24/06* (2013.01); *H01L 23/5226* (2013.01); *H01L 23/5286* (2013.01); *H01L 24/73* (2013.01); *H01L 25/0657* (2013.01); *H01L 25/50* (2013.01); *H01L 23/3107* (2013.01); *H01L 24/05* (2013.01); *H01L 24/16* (2013.01); *H01L 24/45* (2013.01); *H01L 24/48* (2013.01); *H01L 25/0655* (2013.01); *H01L 2224/0401* (2013.01); *H01L 2224/04042* (2013.01); *H01L 2224/061* (2013.01); *H01L 2224/16145* (2013.01); *H01L 2224/45111* (2013.01); *H01L 2224/45116* (2013.01); *H01L 2224/45124* (2013.01); *H01L 2224/45139* (2013.01); *H01L 2224/45144* (2013.01); *H01L 2224/45147* (2013.01); *H01L 2224/48247* (2013.01); *H01L 2224/731* (2013.01); *H01L 2225/0651* (2013.01); *H01L 2225/06513* (2013.01); *H01L 2225/06527* (2013.01);
(Continued)

(58) Field of Classification Search
CPC .............................. H01L 23/48; H01L 23/488
USPC ......... 257/737, 773, 734, 758, 759, 760, 779, 257/780, 781, 784, 690
See application file for complete search history.

(56) References Cited

U.S. PATENT DOCUMENTS 5,497,033 A * 3/1996 Fillion et al. .................. 257/723
8,421,222 B2 * 4/2013 Lin et al. ....................... 257/724
(Continued)

OTHER PUBLICATIONS

PCT Search Report and Written Opinion mailed Apr. 5, 2012 for PCT application No. PCT/US11/057069, 24 pages.

*Primary Examiner* — Chuong A Luu

(57) ABSTRACT

Embodiments of the present disclosure provide a chip that comprises a base metal layer formed over a first semiconductor die and a first metal layer formed over the base metal layer. The first metal layer includes a plurality of islands configured to route at least one of (i) a ground signal or (ii) a power signal in the chip. The chip further comprises a second metal layer formed over the first metal layer. The second metal layer includes a plurality of islands configured to route at least one of (i) the ground signal or (ii) the power signal in the chip.

15 Claims, 8 Drawing Sheets

(51) Int. Cl.
  *H01L 23/522*   (2006.01)
  *H01L 23/528*   (2006.01)
  *H01L 25/065*   (2006.01)
  *H01L 25/00*    (2006.01)
  *H01L 23/31*    (2006.01)

(52) U.S. Cl.
  CPC ............... *H01L2924/01013* (2013.01); *H01L 2924/01014* (2013.01); *H01L 2924/01029* (2013.01); *H01L 2924/01032* (2013.01); *H01L 2924/01079* (2013.01); *H01L 2924/01082* (2013.01); *H01L 2924/014* (2013.01); *H01L 2924/10252* (2013.01); *H01L 2924/10253* (2013.01); *H01L 2924/10271* (2013.01); *H01L 2924/10329* (2013.01); *H01L 2924/14* (2013.01); *H01L 2924/30107* (2013.01); *H01L 2924/01005* (2013.01); *H01L 2924/01006* (2013.01); *H01L 2924/01019* (2013.01); *H01L 2924/01033* (2013.01); *H01L 2924/01047* (2013.01); *H01L 2924/0105* (2013.01); *H01L 2224/05624* (2013.01); *H01L 2224/05647* (2013.01); *H01L 2224/48624* (2013.01); *H01L 2224/48647* (2013.01); *H01L 2224/48824* (2013.01); *H01L 2224/48847* (2013.01); *H01L 2224/48724* (2013.01); *H01L 2224/48747* (2013.01); *H01L 2924/01028* (2013.01)
  USPC .......... 257/737; 257/734; 257/758; 257/759; 257/760; 257/779; 257/780; 257/781; 257/784; 257/690

(56) References Cited

U.S. PATENT DOCUMENTS

| | | | |
|---|---|---|---|
| 2002/0048930 A1 | 4/2002 | Lin | |
| 2005/0048759 A1* | 3/2005 | Hsu ............................... | 438/618 |
| 2007/0026567 A1* | 2/2007 | Beer et al. ..................... | 438/106 |
| 2009/0227070 A1* | 9/2009 | Miyajima ..................... | 438/113 |
| 2010/0044856 A1* | 2/2010 | Sri-Jayantha et al. ........ | 257/717 |
| 2011/0121449 A1* | 5/2011 | Lin et al. ....................... | 257/737 |

\* cited by examiner

POWER/GROUND LAYOUT FOR CHIPS

CROSS REFERENCE TO RELATED APPLICATION

This disclosure claims priority to U.S. Provisional Patent Application No. 61/405,099, filed Oct. 20, 2010, the entire specification of which is hereby incorporated by reference in its entirety for all purposes, except for those sections, if any, that are inconsistent with this specification.

TECHNICAL FIELD

Embodiments of the present disclosure relate to the field of chip packaging, and more particularly, to a power/ground layout using a wire bonding package.

BACKGROUND

There is increasing popularity for smaller electronic devices as society becomes more mobile. The popularity of the smaller electronic devices creates a demand for small, light devices that offer high performance and good reliability. To help meet this demand, size dimensions for a semiconductor die or a chip in an electronic package assembly used in such smaller electronic devices are to be reduced. However, the reduced size dimensions challenge conventional routing configurations of power and/or ground signals for the semiconductor die or chip in the electronic package assembly.

In addition, another challenge is to increase input/output (I/O) functionality to accommodate the advanced technology used in such smaller electronic devices. The advanced technology relies on the increase in I/O functionality to avoid a drop in voltage across contacts or connectors in the semiconductor die or chip. Yet, another challenge is to keep manufacturing costs for the semiconductor die or chip relatively low while providing solutions to these challenges. Additionally, flip-chip packaging arrangements can be expensive. Use of wire-bonding technologies can help reduce the cost of various packaging arrangements.

SUMMARY

The present disclosure provides a method of making a chip. The method comprises forming a base metal layer over a first semiconductor die, forming a first metal layer over the base metal layer and creating a plurality of islands in the first metal layer to route at least one of (i) a ground signal or (ii) a power signal in the chip. The method further comprises forming a second metal layer over the first metal layer creating a plurality of islands in the second metal layer to route at least one of (i) the ground signal or (ii) the power signal in the chip.

The present disclosure also provides a chip that comprises a base metal layer formed over a first semiconductor die and a first metal layer formed over the base metal layer. The first metal layer includes a plurality of islands configured to route at least one of (i) a ground signal or (ii) a power signal in the chip. The chip further comprises a second metal layer formed over the first metal layer. The second metal layer includes a plurality of islands configured to route at least one of (i) the ground signal or (ii) the power signal in the chip.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Integrated circuits or chips are contained in many electronic devices, such as, for example, cellular phones, computers, radios, common household appliances, and the like. A chip includes a semiconductor die, which is made of a semiconductor material in which electronic circuitry is implemented. The chip also includes a package that houses the semiconductor die and includes various materials to provide electrical interconnection of the chip to external electronic components. For instance, wirebonding is a process in the present disclosure that provides the electrical connections for the chip.

Figure 1A:
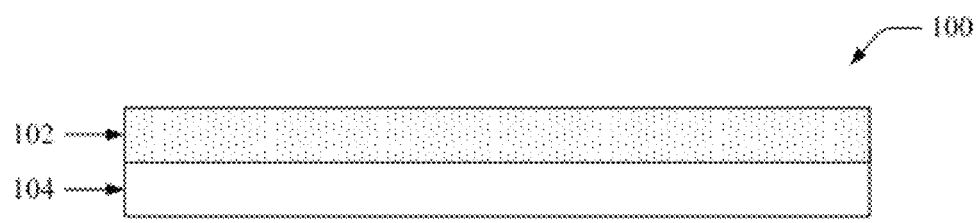
FIGS. 1A-1G illustrate cross-sectional side views of various stages for fabricating a power/ground layout of a chip.

FIGS. 1A-1G illustrate cross-sectional side views of various stages for fabricating a power/ground layout of a chip 100. FIG. 1A illustrates a base metal layer 102 formed over a semiconductor die 104. The base metal layer 102 can include, for example, aluminum (Al), aluminum-copper alloy, copper (Cu), or nickel (Ni). The semiconductor die 104 comprises, for example, silicon (Si), silicon-germanium (SiGe), germanium (Ge), gallium arsenide (GaAs), and the like. In embodiments, the base metal layer 102 can be deposited by processes such as, for example, electrodeposition, evaporation, or a sputtering process. In another embodiment, the base metal layer 102 can be chemically and mechanically planarized. Those skilled in the art are familiar with such processes and thus, these processes will not be described herein.

In an embodiment, the base metal layer 102 provides input/output (I/O) functionality for the chip 100, and more particularly, the semiconductor die 104. The base metal layer 102 also serves as a redistribution layer (RDL) for the chip 100. Thus, the base metal layer 102 is configured with various traces and lines to conduct electrical signals. The base metal layer 102 and semiconductor die 104 are electrically connected to one another such that electrical signals can pass between them.

Figure 1B:
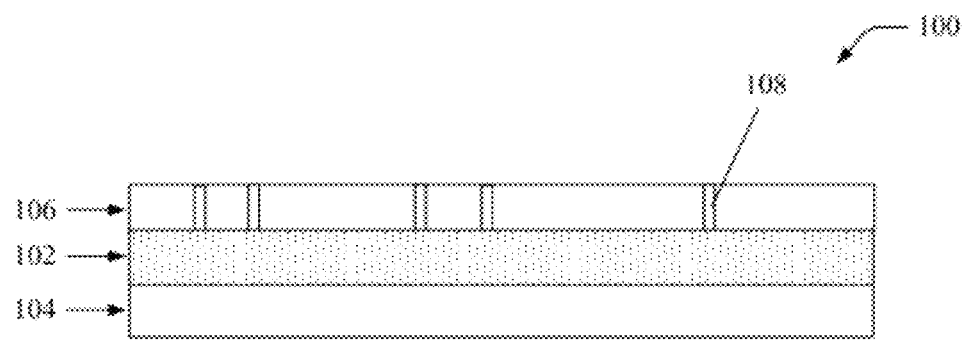

FIG. 1B illustrates an insulating layer 106 formed over the base metal layer 102. The insulating layer 106 can be formed with any dielectric material including, epoxy, polyimide, low-k dielectric, silicon dioxide ($SiO_2$), or the like. The insulating layer 106 separates the conducting parts or layers of the chip 100 from one another and protects the base metal layer 102 from other conducting metal layers of the chip 100.

A number of device features can be formed in the insulating layer 106. The device features can include, for example, bondable traces, a plurality of lines, and a plurality of vias 108. As shown, the vias 108 serve as connectors in the insulating layer 106 to allow a conductive connection between different layers of the chip 100. For example, the vias 108 serve as contacts by connecting the base metal layer 102 to different conductors, such as additional metal layers of the chip 100. In an embodiment, the vias 108 are formed of metal, as is known in the art.

Figure 1C:
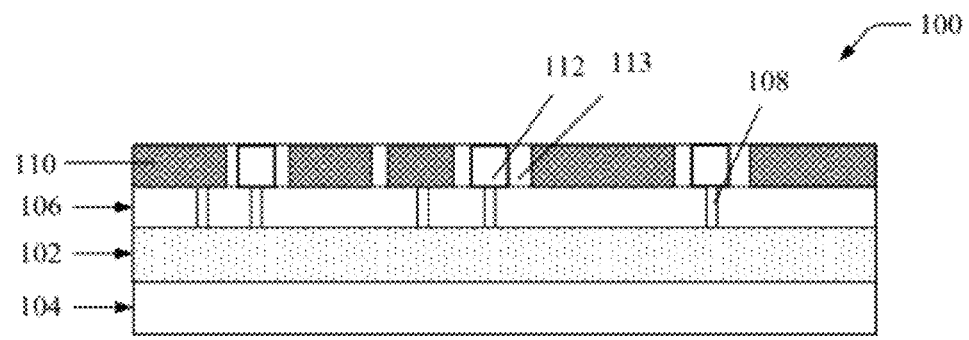

FIG. 1C illustrates a first metal layer 110 formed over the insulating layer 106. The first metal layer 110 can include, for example, copper (Cu), aluminum (Al), aluminum-copper alloy, aluminum-silicon alloy, or nickel (Ni).

In embodiments, an electroplating process, an electrochemical deposition process, or a sputtering process deposits the first metal layer 110 over the insulating layer 106. In yet another embodiment, a damascene process deposits a thin layer of copper that serves as the first metal layer 110 over the insulating layer 106. The first metal layer 110 can be chemically and mechanically planarized in some embodiments. Those skilled in the art are familiar with such processes and thus, these processes will not be described herein.

A plurality of islands 112 defined by one or more openings 113 is formed in the first metal layer 110. The islands 112 can have different dimensions and/or shapes with respect to each other if desired. For example, the plurality of islands 112 generally has a substantially rectangular-shape. In embodiments, the shapes for the plurality of islands 112 can include, but are not limited to, a substantially square-shape, a substantially oval-shape, and a substantially round-shape.

In an embodiment, the plurality of islands 112 is located in a center of the first metal layer 110. The plurality of islands 112 provides an electrical pathway between layers of the chip 100. The plurality of islands 112, as well as the openings 113, also provides stress relief with respect to the first metal layer 110. The center location for the plurality of islands 112 leads to a shorter electrical path between the layers, as will be discussed in further detail herein. The shorter electrical path leads to better electrical performance, based on less inductance and resistance being generated.

In an embodiment, the first metal layer 110 is a solid ground (GND) plane. The first metal layer 110 isolates the signals on top of the GND plane from the signals below the GND plane. In particular, the first metal layer 110 isolates the noise for the signals below within the semiconductor die 104, especially during high current switching. The plurality of islands 112 in the first metal layer 110 is configured to connect a signal, for example, such as $V_{DD}$, from another layer through the first metal layer 110 to the semiconductor die 104, or an I/O signal from the base metal layer 102, to be discussed in further detail herein. The first metal layer 110 acting as a solid GND plane helps reduce a drop in voltage within the chip 100.

Figure 1D:
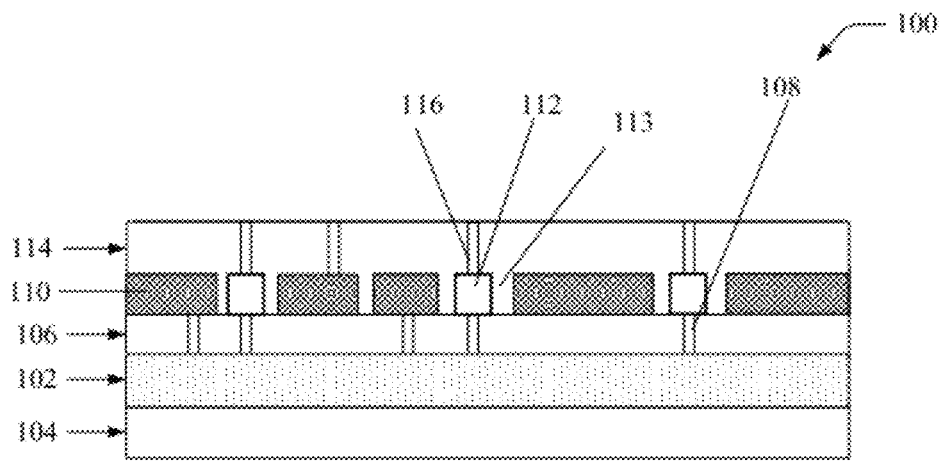

FIG. 1D illustrates a dielectric layer 114 formed over the first metal layer 110. The dielectric layer 114 may be formed with any dielectric material including, for example, oxide, polyimide, low-k dielectric, silicon dioxide ($SiO_2$), or the like. The dielectric layer 114 separates the conducting parts or layers within the chip 100 from one another and protects the first metal layer 110 from the other conducting metal layers. In an embodiment, the dielectric layer 114 is an interlayer dielectric layer.

A number of device features can be formed in the dielectric layer 114. The device features may include, for example, bondable traces, a plurality of lines, and a plurality of vias 116. The vias 116 are a connector in the dielectric layer 114 to connect the first metal layer 110 and the base metal layer 102 to different conductors, such as additional metal layers within the chip 100. In an embodiment, the vias 116 are formed of metal, as is known in the art.

In an embodiment, the vias 116 in the dielectric layer 114 can be positioned in locations that correspond to the locations of the vias 108 of the insulating layer 106 and islands 112. In other words, the vias 108, 116 and islands 112 can be located in similar positions in their respective layers such that they are substantially aligned.

Figure 1E:
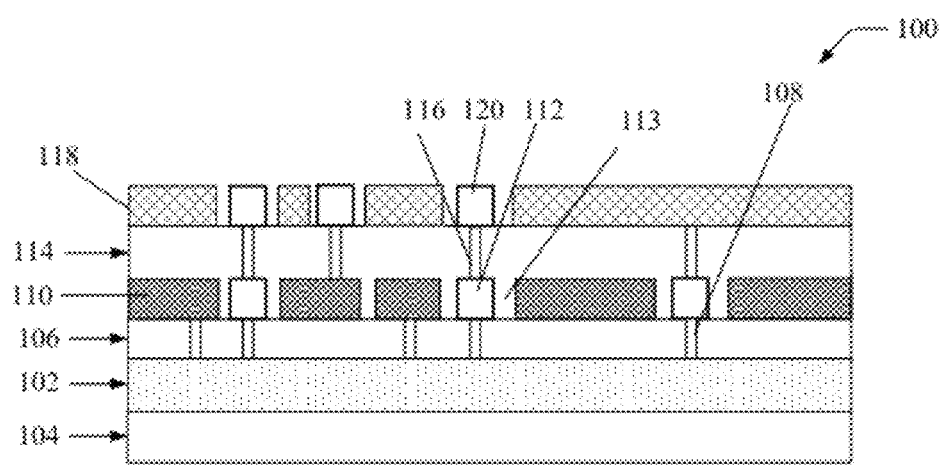

FIG. 1E illustrates a second metal layer 118 formed over the dielectric layer 114. The second metal layer 118 can include, for example, aluminum (Al), aluminum-copper alloy, aluminum-silicon alloy, nickel, or copper (Cu). In embodiments, the second metal layer 118 can be formed over the dielectric layer 114 using suitable processes that are well known, for example, a physical vapor deposition (PVD) process a sputtering process, an electrodeposition, or an evaporative deposition. Those skilled in the art are familiar with such processes and thus, these processes will not be described herein.

A plurality of islands 120 is formed on the second metal layer 118 to provide stress relief and to provide electrical pathways. The islands 120 can have different dimensions and/or shapes with respect to each other if desired. For example, the plurality of islands 120 has a substantially rectangular-shape. In embodiments, the shapes of the plurality of islands 120 include, but are not limited to, a substantially square-shape, a substantially oval-shape, and a substantially round-shape.

In an embodiment, the plurality of islands 120 is located in a center of the second metal layer 118. The center location for the plurality of islands 120 provides a shorter electrical path from the second metal layer 118 to a die stacked on top of the chip 100, as will be described in further detail herein. The shorter electrical path provides better electrical performance, based on less inductance and resistance being generated. In an embodiment, some of the plurality of islands 120 in the second metal layer 118 are positioned in locations that correspond to the locations of some the plurality of islands 112 of the first metal layer 110. In other words, some of the plurality of islands 120, 112 are located in similar positions on each of their respective metal layers 118, 110 such that they are substantially aligned.

In an embodiment, the second metal layer 118 serves as a power plane, which is configured to provide power at the top of the chip 100. The second metal layer 118 receives power from an external device (not shown) through a wirebond connection and provides power to the semiconductor die 104 through the vias 108, 116 and islands 112 and 120 aligned with the vias 108, 116, and through the base metal layer 102, which is serving as an RDL.

Figure 1F:
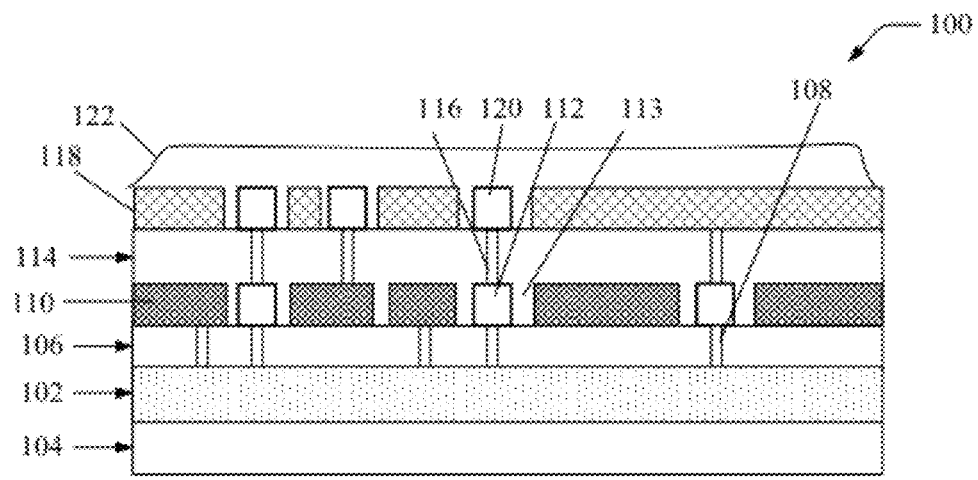

FIG. 1F illustrates a passivation layer 122 formed over the second metal layer 118. The passivation layer 122 may be formed with any suitable material including, for example, oxide, nitride, silicon-oxide, silicon-nitride, or the like. The passivation layer 122 is generally chemically or mechanically planarized. The passivation layer 122 is not required to be planarized if desired. The passivation layer 122 protects the underlying metal layers and the fine-line metal interconnections. The passivation layer 122 also prevents the penetration of mobile ions and other contaminations.

Figure 1G:
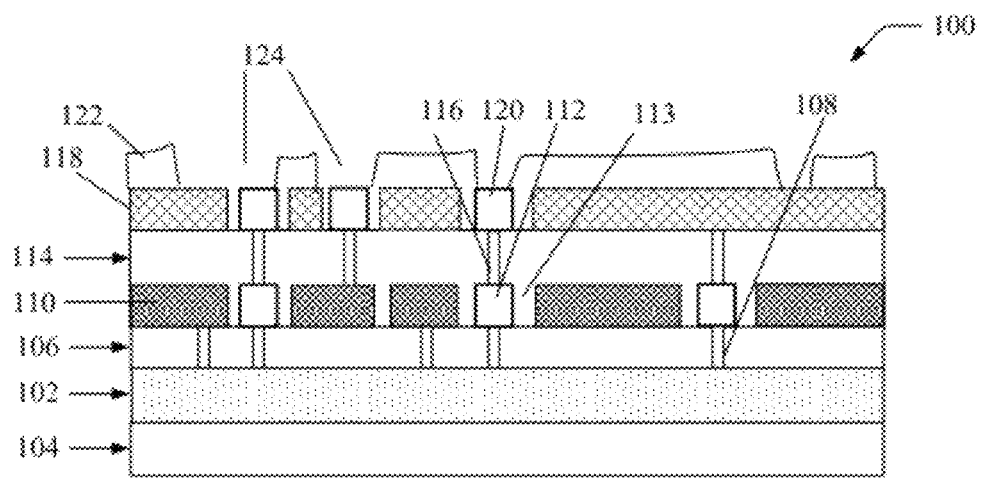

FIG. 1G illustrates one or more openings 124 in the passivation layer 122. The one or more openings 124 in the passivation layer 122 expose contact points in the second metal layer 118 to reduce the amount of heat to provide better heat sink capabilities for the chip 100. The one or more openings 124 also expose islands 120. Additionally, the one or more openings 124 expose the second metal layer 118 to electrically connect with another die (not shown) that can be stacked on the chip 100, as will be discussed further herein.

Thus, as can be seen, the chip 100 includes separate ground and power planes (e.g., the first metal layer 110 and the second metal layer 118, respectively) to provide ground and/ or power signals to the semiconductor die 104. The separate ground and power planes can also provide ground and/or power signals to other dies as will be described in further detail herein.

Figure 2:
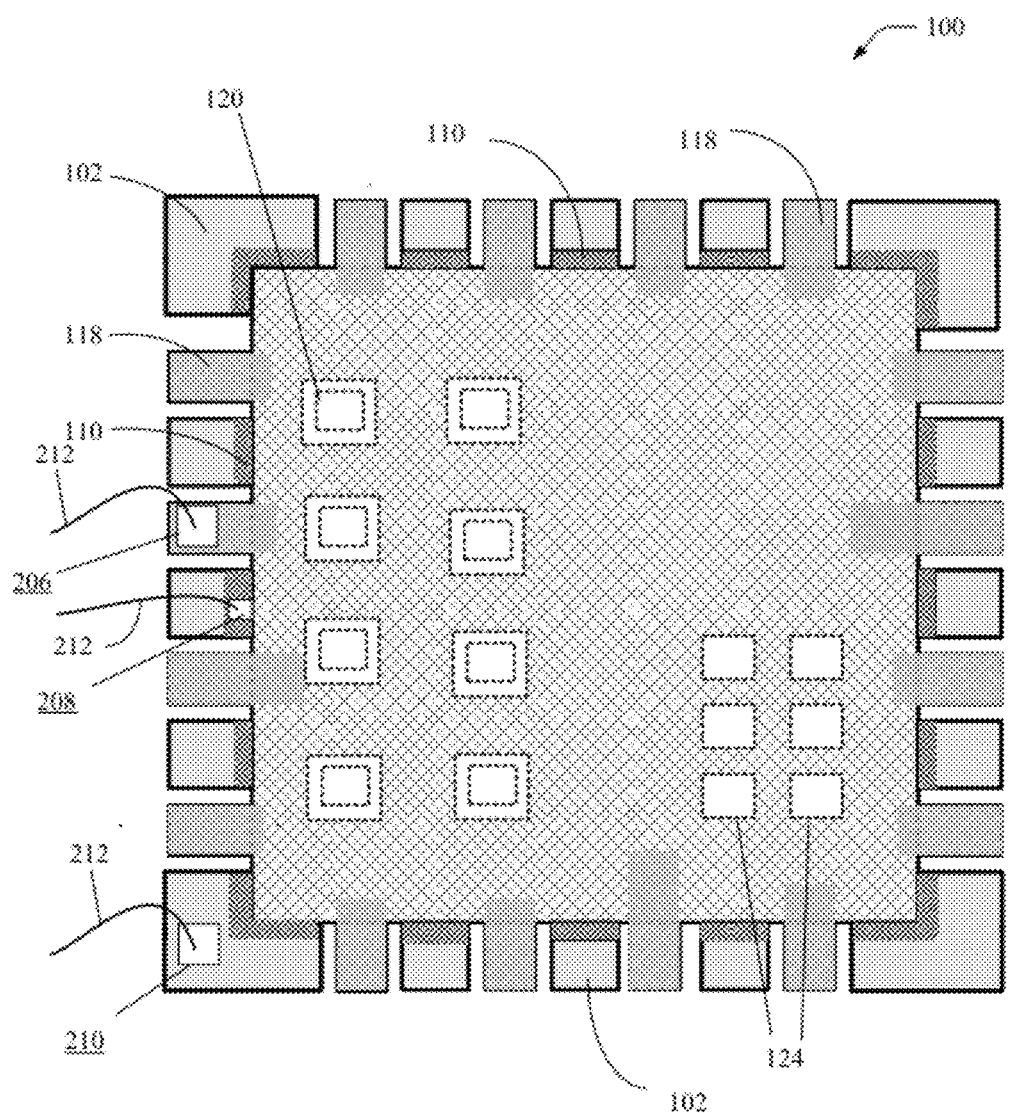
FIG. 2 illustrates a top view of the chip of FIGS. 1A-1G.

FIG. 2 illustrates a top view of the chip 100 of FIG. 1. The passivation layer 122 is not depicted in FIG. 2 for the sake of clarity. The top view illustrates exposed portions of the base metal layer 102, the second metal layer 118, and exposed portions of the first metal layer 110, as well as the plurality of islands 120 in the second metal layer 118, and the one or more openings 124 in the passivation layer 122. The exposed portions of the base metal layer 102 and the first metal layer 110 are located along a periphery of the chip 100 to allow for wirebond connections to the various layers.

The plurality of islands 120 provides electrical pathways and provides stress relief. Likewise, the one or more openings 124 provide stress relief. For example, the stress in the second metal layer 118 results from differences in thermal expansion or from the microstructure of the second metal layer 118 (intrinsic stress). Locations for the plurality of islands 120 are shown as examples, not as actual placement locations. The plurality of islands 120 further represent examples without limiting the number, which may be formed in the second metal layer 118, as well as without limiting a size, dimension or a shape.

FIG. 2 further illustrates examples of multiple contact points. For instance, the contact points provide electrical connections with the bond pads 206, 208, 210 coupled to bondwires 212 at multiple locations. The bond pads 206, 208, 210 are generally located along a peripheral edge of the semiconductor die 104 on exposed portions of the various metal layers 102, 110 and 118. For example, bond pad 206 is located on the second metal layer 118, bond pad 208 is located on an exposed portion of the first metal layer 110, and bond pad 210 is located on an exposed portion of the base metal layer 102.

In an embodiment, the $V_{DD}$ power from an external device (not illustrated) is received at the bond pad 206 located on the second metal layer 118 through the bondwire 212. The $V_{DD}$ power is provided from the second metal layer 118 to the base metal layer 102 through pathways defined by a via 116, an island 112 and a via 108 (as illustrated in FIGS. 1B-1E). The $V_{DD}$ power is then provided from the base metal layer 102 to the semiconductor die 104 through an electrical connection (not illustrated) between the base metal layer 102 and the semiconductor die 104. Isolation is provided in the chip 100 to avoid unwanted interaction of components with each other. For example, the vias 108, 116 make contact with the first metal layer 110, which serves as the GND plane appearing to the signals as an infinite ground potential.

In another embodiment, the GND signal is received at the bond pad 208 of the first metal layer 110 through the bondwire 212. The GND signal can then be provided to the base metal layer 102 through a via 108 and thereby provided to the semiconductor die 104. Additionally, the plurality of islands 120 provide an electrical pathway of the GND signal from the first metal layer 110 to another die that can be stacked on top of the chip 100. For example, the electrical pathway of the GND signal can include the first metal layer 110 to the via 116 (illustrated in FIGS. 1E-1G of the cross-sectional views), to an island 120, through an opening 124 in the passivation layer 122 and to the another die stacked on top of the chip 100, as will be described further herein.

Additionally, an I/O signal can be received at a bond pad 210 of the base metal layer 102 through the bondwire 212, either from an external device (not shown) or from the semiconductor die 104. Also, an I/O signal can be brought from the semiconductor die 104 through the base metal layer 102 to the second metal layer 118 and/or to the another die stacked on top of the chip 100. For example, the electrical pathway of the I/O signal begins at the base metal layer 102, passes through the via 108 (illustrated in FIGS. 1B-1E of the cross-sectional views), and passes through an island 112 in the first metal layer 110 (i.e., the GND plane). The electrical pathway further passes through the via 116 (illustrated in FIGS. 1E-1G of the cross-sectional views), to the second metal layer 118 (i.e., the power plane), and to the another die stacked on top of the chip 100.

Figure 3:
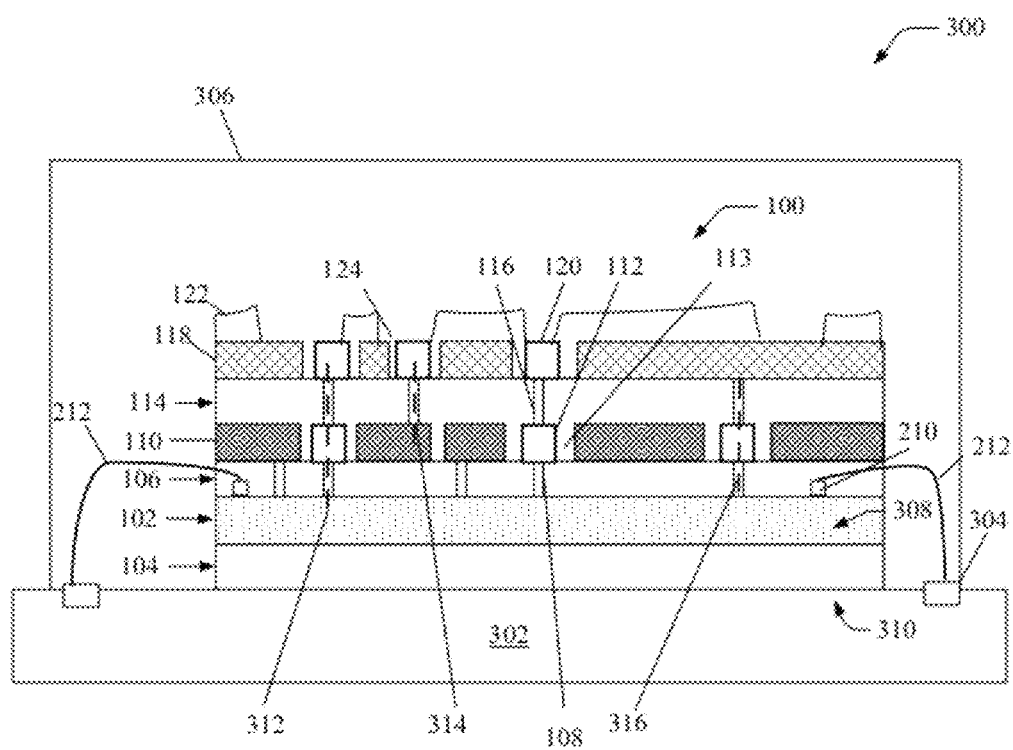
FIG. 3 illustrates a cross-sectional view of an electronic package assembly that includes the chip of FIGS. 1A-1G.

FIG. 3 illustrates a cross-sectional view of an electronic package assembly 300 that includes the chip 100. In an embodiment, the electronic package assembly 300 includes the chip 100 mounted on a lead frame 302, one or more bondwires 212, one or more bond pads 206 located on the second metal layer 118, one or more lead fingers 304, and molding compound 306.

The lead frame 302 can be formed of a metal frame to support the semiconductor die 104 for packaging. The lead frame 302 may be made from, but not limited to, copper or copper alloy. Because the chip 100 includes a ground plane (e.g. first metal layer 110) and a power plane (e.g. second metal layer 118), lead frame 302 does not need to include a ground plane or a power plane.

The bondwires 212 can be formed between the bond pads 206 and the lead fingers 304. The termination points of the bondwires 212 may be of ball, wedge, or another configuration, as is known in the art, and formed with a wirebonding machine. The bondwires 212 may be formed of materials that include, but are not limited to, aluminum (Al), copper (Cu), gold (Au), silver (Ag), tin-lead alloy, or aluminum alloy. The bond pads 206 may be formed of aluminum (Al), copper (Cu), or another suitable material that is known for conductive properties.

The molding compound 306 encapsulates the bondwires 212 and the semiconductor die 104. The molding compound 306 generally comprises an electrically insulative material, such as a thermosetting resin, that is disposed to protect the semiconductor die 104 from moisture, oxidation, or chipping associated with handling. In another embodiment, the molding compound 306 is disposed to substantially fill a region between the second metal layer 118 and another die.

FIG. 3 illustrates the semiconductor die 104 having an active side 308 (e.g., a front side) of a surface with integrated circuitry constructed thereon and an inactive side 310 (e.g., a backside) of a surface without any circuitry constructed thereon. The integrated circuitry is electrically accessible via the bond pads 206 located at the exposed portion of the base metal layer 102 (as can be seen in FIG. 2). The bondwires 212 are provided to connect the bond pads 206 on the base metal layer 102 of the chip 100 to appropriate lead fingers 304 of the lead frame 302. In addition, the active side 308 of the semiconductor die 104 is substantially parallel with the first metal layer 110 and the second metal layer 118.

In an embodiment, some of the plurality of islands 112 in the first metal layer 110 are configured to connect an I/O signal and/or provide access to the active side 308 of the die 104 from the base metal layer 102 to other stacked die applications through vias 116, 108, and island 120, as illustrated by 312 as a pathway. This will be discussed further herein. In addition, some of the plurality of islands 120 in the second metal layer 118 are configured to connect the GND signal from the first metal layer 110 to other stacked die applications through vias 116, as illustrated by 314 as a pathway, and as will be discussed further herein. The other stacked die applications may include, for example, dynamic random-access memory (DRAM), flash stack die, or flip chip. The $V_{DD}$ power is provided from the second metal layer 118 to the base metal layer 102 through a pathway 316 defined by a via 116, an island 112 and a via 108.

The roles of the first metal layer 110 and the second metal layer 118 may be reversed such that the first metal layer 110 is the power plane and the second metal layer 118 is the GND plane. Thus, the roles of the plurality of islands 112 in the first metal layer 110 and the plurality of islands 120 in the second metal layer 118 would be reversed such that the plurality of islands 112 in the first metal layer 110 are configured to route the GND signals through the other layers and the plurality of islands 120 in the second metal layer 118 are configured to route the power and I/O signals through the metal layers. For clarity, the Detailed Description will continue to describe the embodiment in which the first metal layer 110 is the GND plane and the second metal layer 118 is the power plane.

Figure 4:
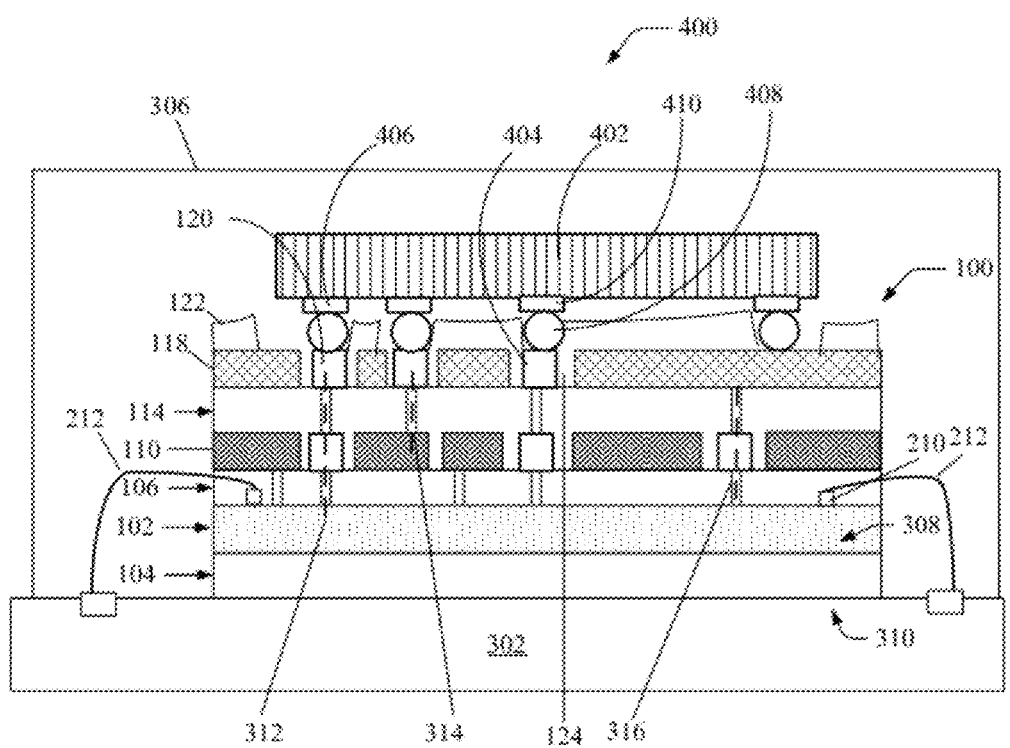
FIG. 4 illustrates a cross-sectional side view of the chip of FIGS. 1A-1G with another die stacked on top.

FIG. 4 illustrates a cross-sectional side view of a packaging arrangement 400 in which a second die 402 is stacked on top of the chip 100. Housing more than one die in a given package is referred to as "System in a Package" (SIP) or three-dimensional integrated circuit. Such a packaging arrangement offers tremendous space savings by assembling multiple individually fabricated dies that perform different functions into a single package to produce complex electronic consumer products. FIG. 4 illustrates two dies stacked in a vertical manner, but can include die stacking of multiple dies stacked in vertical and horizontal integration arrangements.

The passivation layer 122 provides one or more openings 124 to expose contact points 404 in the second metal layer 118. The contact points 404 are located at points to provide power from the second metal layer 118 to the second die 402. The contact points 404 are also located at corresponding islands 120 to allow for a ground signal to be provided to the second die 402 from the first metal layer 110 and to allow for I/O signals to be provided between the second die 402 and the base metal layer 102, and thereby the semiconductor die 104. Interconnect structures 406, such as, for example, bumps, pads, posts, pillars, balls or any suitable structure that electrically couples the chip 100 to the second die 402, may be used to route electrical signals between the contact points 404 and the second die 402. The second die 402 connects, through the bondwires 212, to the lead frame 302. The second die 402 can be stacked onto the chip 100 via, for example, a flip chip process. As can be seen in FIG. 4, the second die 402 is coupled to the chip 100 with interconnect structures 406 in the form of solder bumps 408 that are coupled to pads 410.

Figure 5:
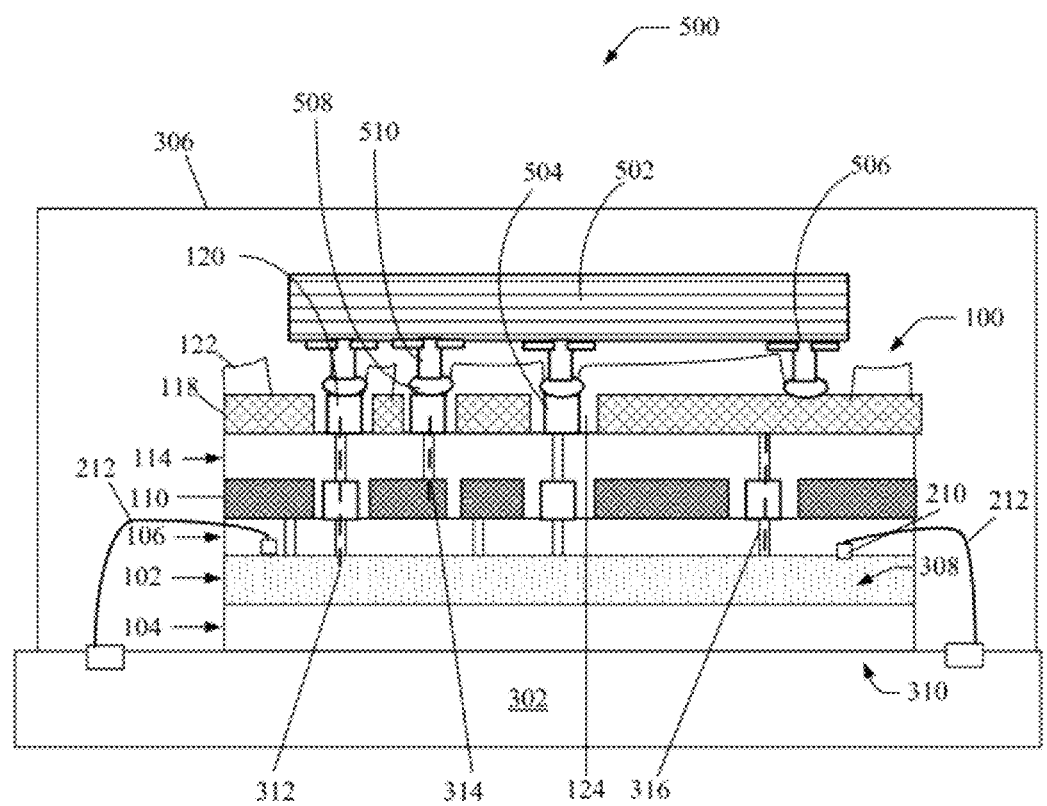
FIG. 5 illustrates a cross-sectional side view of another arrangement of the chip of FIGS. 1A-1G with another die stacked on top.

FIG. 5 illustrates another cross-sectional side view of a packaging arrangement 500 of the chip 100 in which a second die 502 is stacked on top of the chip 100. FIG. 5 illustrates two dies stacked in a vertical manner, but can include stacking of multiple dies in vertical and/or horizontal integration arrangements.

The passivation layer 122 creates the one or more openings 124 to expose contact points 504 in the second metal layer 118. The contact points 504 are located at points to provide power from the second metal layer 118 to the second die 502. The contact points 504 are also located at corresponding islands 120 to allow for a ground signal to be provided to the second die 502 from the first metal layer 110 and to allow for I/O signals to be provided between the second die 502 and the base metal layer 102, and thereby the semiconductor die 104. Interconnect structures 506, such as, for example, bumps, posts, pillars, balls or any suitable structure that electrically couples the chip 100 to the second die 502, may be used to route electrical signals between the contact points 504 and the second die 502. The second die 502 connects through the bondwires 212 to the lead frame 302. The second die 502 can be stacked onto the chip 100 via, for example, a flip chip process. As can be seen in FIG. 5, the second die 502 is coupled to the chip 100 with interconnect structures 506 in the form of solder bumps 508 and pillars 510.

Although only two semiconductor dies (e.g., 104 and 402 or 502) are depicted in the electronic package assembly of FIGS. 4 and 5, additional semiconductor dies can be disposed within the electronic package assembly either in a stacked configuration or in a side-by-side configuration in other embodiments. The additional dies can likewise be coupled to the base metal layer 102 or the second metal layer 118 for routing of power and/or ground signals using techniques as described herein. For example, the bond pads 206 can facilitate electrical coupling of the additional dies to the second metal layer 118 using techniques described herein.

The power/ground layout of the chip 100 increases the I/O functionality by providing multiple bond pad sites located on the base metal layer 102, the first metal layer 110, and the second metal layer 118 for the I/O, GND, and/or power signals through the bondwires 212. In addition, the first metal layer 110 as the GND plane reduces the drop in voltage by providing mechanisms for electrical connections to the different layers in a more efficient manner. Overall, this electronic package assembly markedly reduces the drop in voltage and keeps the size of the electronics package small while increasing I/O functionality and keeping costs down.

Figure 6:
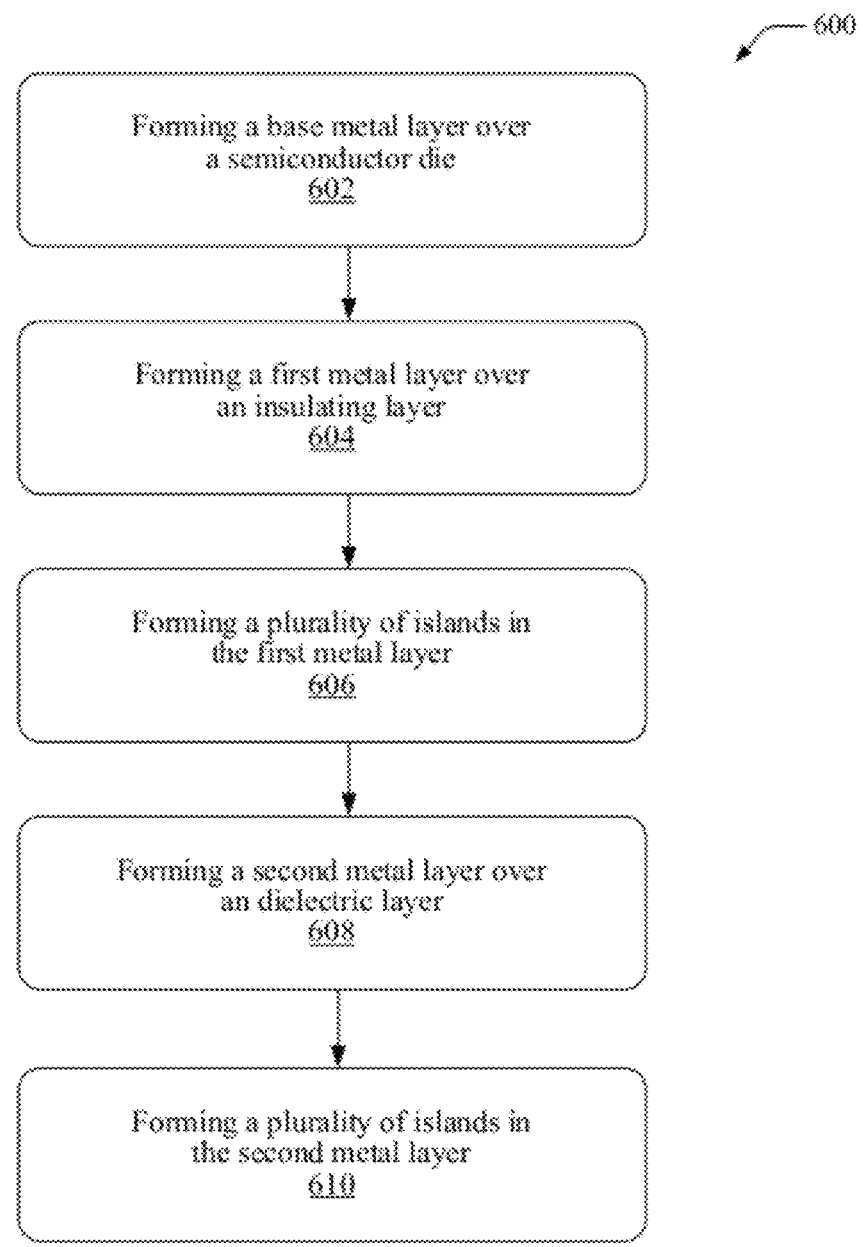
FIG. 6 illustrates a process flow diagram of a method to fabricate a power/ground layout of the chip of FIGS. 1A-1G.

FIG. 6 illustrates a process flow diagram 600 of a method to fabricate a power/ground layout of the chip 100. For brevity, the methods of forming an insulating layer 106, a dielectric layer 114, a passivation layer 122 and vias 108, 116 in the layers will be mentioned with reference as part of the discussion in the forming of the metal layers.

At 602, the method includes forming a base metal layer 102 over a semiconductor die 104. The base metal layer 102 is coupled to the semiconductor die 104 as part of the fabrication of the semiconductor die 104 or based on known packaging or assembly processes. The insulating layer 106 is formed over the base metal layer 102 to protect the base metal layer 102 from the other conductive layers. Next, a plurality of vias 108 is formed in the insulating layer 106 to provide a mechanism for connecting the base metal layer 102 to the different conductive layers.

At 604, the method includes forming a first metal layer 110 over the insulating layer 106, which is formed over the base metal layer 102. As discussed, the first metal layer 110 serves as the GND plane to isolate the signal noise below, especially during high current switching.

At 606, the method includes forming a plurality of islands 112 in the first metal layer 110. The plurality of islands 112 facilitate electrical connections through the various layers. A dielectric layer 114 is formed over the first metal layer 110 to protect the first metal layer 110 from other conductive layers. Next, a plurality of vias 116 is formed in the dielectric layer 114 to provide a mechanism for connecting the first metal layer 110 to different conductive layers.

At 608, the method further includes forming a second metal layer 118 over the dielectric layer 114, which is formed over the first metal layer 110. As discussed, the second metal layer 118 serves as the power plane.

At 610, the method further includes forming plurality of islands 120 in the second metal layer 118. The plurality of islands 120 connect the GND signals from the first metal layer 110 to the stacked dies 402, 502, and I/O signals from the base metal layer 102 to the stacked dies 402, 502.

At 612, a passivation layer 122 is formed over the second metal layer 118 to protect the second metal layer 118 from other conductive layers. The one or more openings 124 are formed in the passivation layer 122 to expose the second metal layer 118 and provide a mechanism to connect the first metal layer 110 to the stacked dies 402, 502. For example, the process for the semiconductor fabrication is a 65 nanometer (nm) process or a 45 nm process to produce chip sizes of 65 nm or 45 nm or smaller.

The description may use perspective-based descriptions such as over/under. Such descriptions are merely used to facilitate the discussion and are not intended to restrict the application of embodiments described herein to any particular orientation.

The terms chip, die, integrated circuit, monolithic device, semiconductor device, and chip are often used interchangeably in the microelectronics field. The present invention is applicable to all of the above as they are generally understood in the field.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A chip comprising:
   a base metal layer formed over a first semiconductor die;
   a first metal layer that is separate from the base metal layer, the first metal layer having a plurality of islands individually surrounded along their entire periphery by a dielectric material, wherein the plurality of islands are configured to route at least one of (i) a ground signal or (ii) a power signal in the chip; and
   a second metal layer that is separate from the first metal layer, the second metal layer having a plurality of islands individually surrounded along their entire periphery by a passivation material, wherein the plurality of islands are configured to route at least one of (i) the ground signal or (ii) the power signal in the chip,
   wherein the plurality of islands of the first metal layer is configured to align with the plurality of islands of the second metal layer, and
   wherein at least some of the plurality of islands of the first metal layer are connected to at least some of the plurality of islands of the second metal layer by vias.

2. The chip of claim 1, wherein (i) the first metal layer comprises at least one of copper (Cu), nickel, aluminum (Al), aluminum-silicon alloy, or aluminum-copper alloy, and (ii) the second metal layer comprises at least one of copper (Cu), nickel, aluminum (Al), aluminum-silicon alloy, or aluminum-copper alloy.

3. The chip of claim 1, wherein at least one of (i) the first metal layer and (ii) the second metal layer comprises openings defined therein to provide stress relief from thermal expansion of the first metal layer or the second metal layer.

4. The chip of claim 3, wherein the openings are in a center location of (i) the first metal layer or (ii) the second metal layer.

5. The chip of claim 1, wherein the plurality of islands in the first metal layer is configured to provide an electrical pathway to connect the power signal from the second metal layer to the base metal layer.

6. The chip of claim 1, wherein the plurality of islands in the second metal layer is configured to provide an electrical pathway to connect the ground signal from the first metal layer to a second semiconductor die stacked on top of the chip.

7. The chip of claim 1, wherein:
   the first metal layer is a ground plane, and
   the second metal layer is a power plane.

8. The chip of claim 1, further comprising:
   an insulating layer configured to separate the base metal layer from the first metal layer;
   a dielectric layer comprising the dielectric material, wherein the dielectric layer is configured to separate the first metal layer from the second metal layer; and
   a passivation layer configured to protect the second metal layer from exposure.

9. The chip of claim 1, further comprising:
   a passivation layer comprising the passivation material, wherein the passivation layer is formed over the second metal layer, and wherein the passivation layer includes one or more openings to expose contact points in the second metal layer; and
   a second semiconductor die configured to stack on the one or more openings in the passivation layer to thereby electrically couple the second semiconductor die to the chip,
   wherein the second semiconductor die is electrically coupled to the second metal layer through one of (i) a solder bump or (ii) a copper pillar and a solder bump.

10. A chip comprising:
    a base metal layer formed over a first semiconductor die;
    a first metal layer that is separate from the base metal layer, the first metal layer including (i) a first layer portion and (ii) a first island portion, wherein the first island portion is separated from the first layer portion by a first channel that surrounds the first island portion along the entire periphery of the first island portion; and
    a second metal layer that is separate from the first metal layer, the second metal layer including (i) a second layer portion and (ii) a second island portion, wherein the second island portion is separated from the second layer portion by a second channel that surrounds the second island portion along the entire periphery of the second island portion, wherein the first island portion of the first metal layer is (i) configured to align with the second island portion of the second metal layer, and (ii) connected to the second island portion of the second metal layer by a via.

11. The chip of claim 10, further comprising a passivation layer covering the second metal layer, wherein the passivation layer includes an opening positioned to be substantially over the second island portion by a via, and the opening provides relief from stress at least in the passivation layer and the second metal layer.

12. The chip of claim 10, wherein the first island portion in the first metal layer is configured to provide an electrical pathway to connect a power signal from the second metal layer to the base metal layer.

13. The chip of claim 10, wherein the second island portion in the second metal layer is configured to provide an electrical pathway to connect a ground signal from the first metal layer to a second semiconductor die stacked on top of the chip.

14. The chip of claim 10, further comprising:

an insulating layer configured to separate the base metal layer from the first metal layer;

a dielectric layer configured to separate the first metal layer from the second metal layer; and a passivation layer configured to protect the second metal layer from exposure.

15. The chip of claim 10, further comprising:

a passivation layer formed over the second metal layer, the passivation layer including one or more openings configured to expose contact points on the second metal layer; and a second semiconductor die configured to stack on the one or more openings of the passivation layer to thereby electrically couple the second semiconductor die to the chip, wherein the second semiconductor die is electrically coupled to the second metal layer through one of (i) a solder bump or (ii) a copper pillar and a solder bump.

* * * * *